(12) United States Patent
Hsieh

(10) Patent No.: US 9,559,676 B1
(45) Date of Patent: Jan. 31, 2017

(54) OUTPUT BUFFER APPARATUS FOR CONTROLLING RATE OF RISING/FALLING EDGE OF BUFFERED SIGNAL

(71) Applicant: VIA Technologies, Inc., New Taipei (TW)

(72) Inventor: Ming-Yu Hsieh, New Taipei (TW)

(73) Assignee: VIA Technologies, Inc., New Taipei (TW)

(*) Notice: Subject to any disclaimer, the term of this patent is extended or adjusted under 35 U.S.C. 154(b) by 0 days.

(21) Appl. No.: 14/993,104

(22) Filed: Jan. 12, 2016

(30) Foreign Application Priority Data

Aug. 31, 2015 (TW) .............................. 104128578 A

(51) Int. Cl.
*H03K 3/00* (2006.01)
*H03K 5/12* (2006.01)
*H03K 17/687* (2006.01)

(52) U.S. Cl.
CPC ............ *H03K 5/12* (2013.01); *H03K 17/6872* (2013.01)

(58) Field of Classification Search
CPC ................................ H03K 5/12; H03K 17/6872
See application file for complete search history.

(56) References Cited

U.S. PATENT DOCUMENTS

| | | | |
|---|---|---|---|
| 5,912,569 A * | 6/1999 | Alleven | H03K 5/151 326/27 |
| 5,929,664 A * | 7/1999 | Alleven | H03K 17/162 327/108 |
| 5,973,534 A | 10/1999 | Singh | |
| 6,366,115 B1 | 4/2002 | DiTommaso | |
| 6,850,100 B2 * | 2/2005 | Takeshita | H03K 17/166 327/112 |
| 7,279,925 B1 | 10/2007 | Richmond et al. | |
| 7,940,093 B2 | 5/2011 | Shiah et al. | |

FOREIGN PATENT DOCUMENTS

| | | |
|---|---|---|
| CN | 102647175 | 8/2012 |
| CN | 102195578 | 11/2013 |
| CN | 104485942 | 4/2015 |
| TW | 201320294 | 5/2013 |

OTHER PUBLICATIONS

"Office Action of Taiwan Counterpart Application", issued on Apr. 22, 2016, p. 1-p. 9.
Intel Corporation, "Design Guide for a Low Speed Buffer for the Universal Serial Bus," Dec. 1996, pp. 1-35.

\* cited by examiner

*Primary Examiner* — Kenneth B Wells
(74) *Attorney, Agent, or Firm* — Jianq Chyun IP Office

(57) ABSTRACT

An output buffer apparatus is provided. A clamp circuit outputs a clamp voltage through a transistor pair having a first configuration. A bias circuit outputs a bias voltage through a transistor pair having a second configuration. A rate control circuit for rising/falling edge buffers an input signal according to the clamp voltage and the bias voltage to generate a buffered signal.

9 Claims, 4 Drawing Sheets

US 9,559,676 B1

OUTPUT BUFFER APPARATUS FOR CONTROLLING RATE OF RISING/FALLING EDGE OF BUFFERED SIGNAL

CROSS-REFERENCE TO RELATED APPLICATION

This application claims the priority benefit of Taiwan application serial no. 104128578, filed on Aug. 31, 2015. The entirety of the above-mentioned patent application is hereby incorporated by reference herein and made a part of this specification.

BACKGROUND OF THE INVENTION

Field of the Invention

The invention relates to an electronic device, and more particularly to an output buffer apparatus.

Description of Related Art

Modern IC designs have become more precise, and therefore the demand for signal accuracy has become greater. In the case of an output buffer circuit, in the design of an output buffer circuit, specifications of rising time and falling time are usually defined according to the size of the load. For instance, when a buffer circuit needs to drive a greater load, to ensure the rising time and the falling time of the driving signal outputted thereby is not too long, driving capabilities need to be increased to meet the demand of the load end. Since the rising time and the falling time of the signal provided by the buffer circuit are related to the proper functioning of the load end circuit, how to make the buffer circuit provide the correct signal is a very important topic.

SUMMARY OF THE INVENTION

Accordingly, the invention provides an output buffer apparatus capable of matching the rising and falling times of a buffered signal.

An output buffer apparatus in accordance with an exemplary embodiment of the disclosure includes a clamp circuit, a bias circuit, and a rate control circuit for rising/falling edge. The clamp circuit outputs a clamping voltage through a transistor pair having a first configuration. The bias circuit outputs a bias voltage through a transistor pair having a second configuration. The rate control circuit for rising/falling edge is coupled to the clamp circuit and the bias circuit, buffers an input signal to generate a buffered signal, and controls a rate of rising/falling edge of the buffered signal according to the clamp voltage and the bias voltage.

Based on the above, in the embodiments of the disclosure, the clamp voltage is outputted via the clamp circuit through the transistor pair having a first configuration, and the bias voltage is outputted via the bias circuit through the transistor pair having a second configuration, so as to allow the rate control circuit for rising/falling edge to buffer the input signal to generate the buffered signal according to the clamp voltage and the bias voltage. In this way, the rising/falling rate of the buffered signal can be effectively controlled, such that the rising and falling times of the buffered signal are matched.

The following embodiments of the invention and figures illustrate the above-described features.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
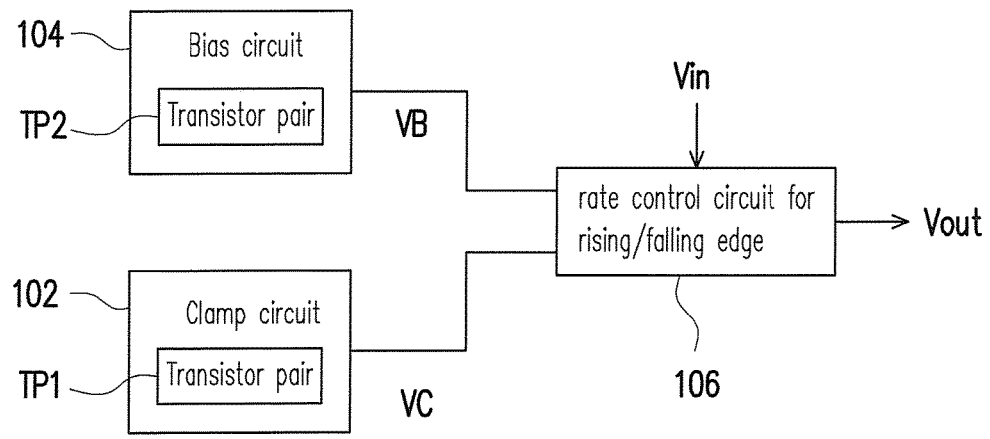
FIG. 1 is a schematic of an output buffer apparatus according to an embodiment of the invention.

Reference will now be made in detail to the preferred embodiments of the invention, instances of which are illustrated in the accompanying drawings. Wherever possible, the same reference numbers are used in the drawings and the description to refer to the same or like parts.

FIG. 1 is a schematic of an output buffer apparatus according to an embodiment of the invention. Please refer to FIG. 1. Output buffer apparatus includes a clamp circuit 102, a bias circuit 104, and a rate control circuit for rising/falling edge 106, wherein the rate control circuit for rising/falling edge 106 is coupled to the clamp circuit 102 and the bias circuit 104. In an embodiment of the disclosure, the output buffer apparatus may be applied for instance in a configuration channel (CC) pin of a Type-C USB connector. The clamp circuit 102 is capable of outputting a clamp voltage VC through the transistor pair having a first configuration TP1, and the bias circuit 104 is capable of outputting the bias voltage VB through the transistor pair having a second configuration TP2, and the rate control circuit for rising/falling edge 106 is capable of buffering an input signal Vin to generate a buffered signal Vout. Due to the mutually complementary form of the transistor pair TP1 and transistor pair TP2, if there is process variation (e.g. SF corner or FS corner process variation), complementary voltage variation in the clamp voltage VC and the bias voltage VB provided through the transistor pair TP1 and transistor pair TP2 will occur, thus allowing the rate control circuit for rising/falling edge 106 generating the buffered signal Vout according to clamp voltage VC and bias voltage VB to effectively match the rising rate of rising edge and the falling rate of the falling edge of the buffered signal Vout. In an embodiment of the disclosure, in the first configuration of the transistor pair TP1, a P-type transistor is coupled to an operation voltage VCC, and an N-type transistor is coupled to a ground voltage. In the second configuration of the transistor pair TP2, an N-type transistor is coupled to the operation voltage VCC and the P-type transistor is coupled to the ground voltage. In an embodiment of the disclosure, the bias circuit 104 is an independent bias circuit, which only provides a bias VB to the rate control circuit for rising/falling edge 106 and is not coupled to another circuit.

Figure 2:
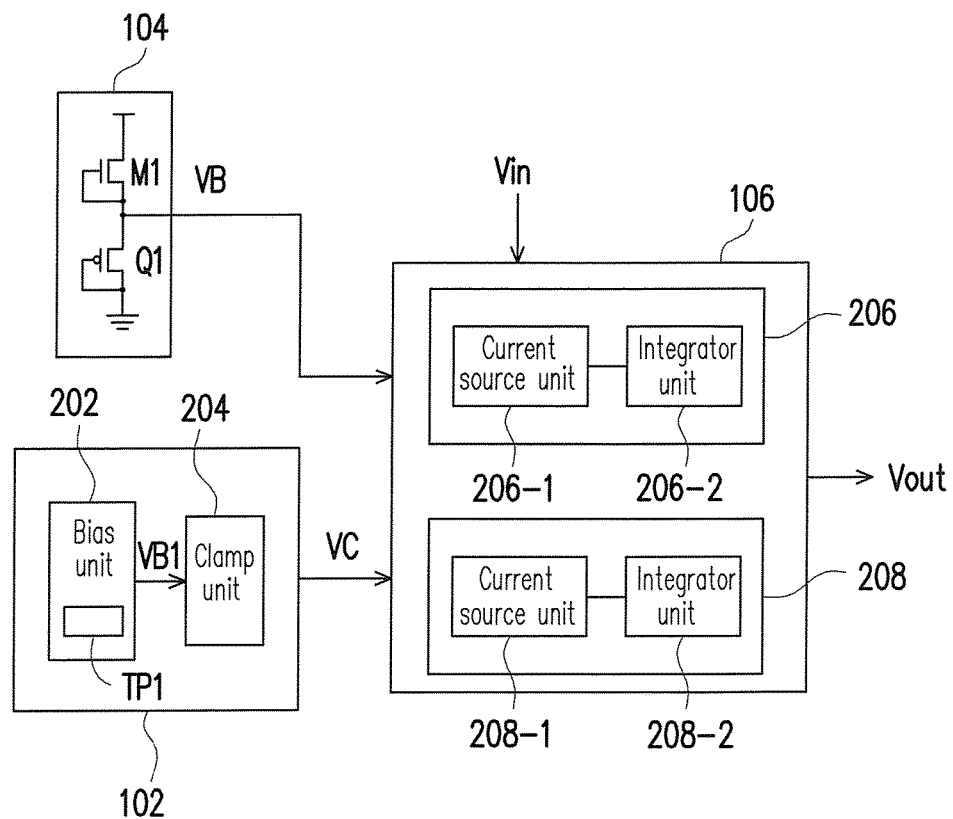
FIG. 2 is a schematic of an output buffer apparatus according to another embodiment of the invention.

FIG. 2 is a schematic of an output buffer apparatus according to another embodiment of the invention. Please refer to FIG. 2. Furthermore, the clamp circuit 102 of FIG. 1 may include a bias unit 202 and a clamp unit 204, wherein the clamp circuit 202 includes the above described transistor pair TP1, the bias unit 202 through the transistor pair TP1 outputs a bias signal VB1, and the clamp unit 204 is capable of generating the clamp voltage VC according to the bias signal VB1. The bias circuit 104 may include a P-type transistor Q1 and an N-type transistor M1 (P-type transistor Q1 and N-type transistor M1 includes transistor pair TP2), wherein a drain of the N-type transistor M1 is coupled to the operation voltage VCC, and a gate and a source of the N-type transistor M1 are connected, and the P-type transistor Q1 is coupled between a source of the N-type transistor M1 and a ground voltage. A gate and a drain of the P-type transistor Q1 are connected to each other, and a common contact point of the N-type transistor M1 and the P-type transistor Q1 is used to output a bias voltage VB. Additionally, the rate control circuit for rising/falling edge 106 may include a rising edge rate control unit 206 and a falling edge rate control unit 208, wherein the rising edge rate control unit 206 includes a current source unit 206-1 and an integrator unit 206-2, and wherein the falling edge rate control unit 208 includes a current source unit 208-1 and an integrator unit 208-2.

Figure 3:
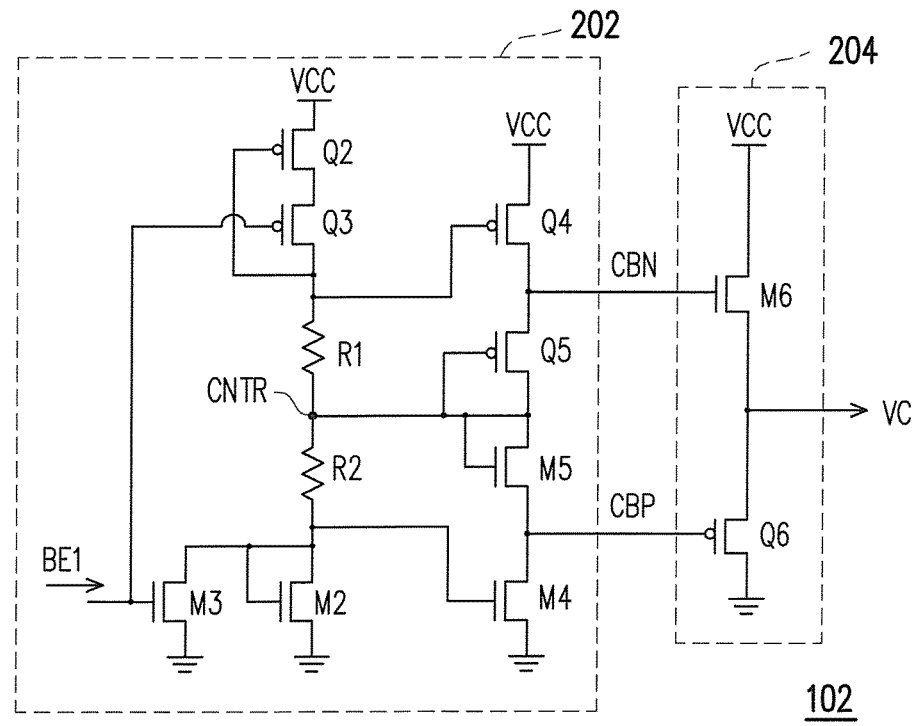
FIG. 3 is a schematic of a clamp circuit according to an embodiment of the invention.

More specifically, implementation of the clamp circuit 102 may be as shown in FIG. 3, bias unit 202 may include P-type transistors Q2~Q5, dividing resistances R1, R2, and N-type transistors M2~M5, and the clamp unit 204 may include transistors Q6 and M6. In the bias unit 202, a drain of the P-type transistor Q2 is coupled to the operation voltage VCC. The P-type transistor Q3 is coupled between a drain of the P-type transistor Q2 and the dividing resistance R1. A drain of the P-type transistor Q3 is coupled to a gate of the P-type transistor Q2. The dividing resistances R1 and R2 are serially connected between a drain of the N-type transistor M2 and a drain of the P-type transistor Q3. A source of the N-type transistor M2 is coupled to the ground, and a gate and a drain of the N-type transistor M2 are connected. The N-type transistor M3 is coupled between a drain of the N-type transistor M2 and the ground voltage. Additionally, the P-type transistor Q4 is coupled between the operation voltage VCC and a source of the P-type transistor Q5. A drain of the P-type transistor Q5 is coupled to a drain of the N-type transistor M5. A source of the N-type transistor M5 is coupled to a drain of the N-type transistor M4. A source of the N-type transistor M4 is coupled to the ground voltage. Wherein a gate of the P-type transistor Q4 is coupled to a common contact point of the P-type transistor Q3 and the dividing resistance R1. A gate and a drain of the P-type transistor Q5 are connected. A gate and a drain of the N-type transistor M5 is also connected, and the gate of the P-type transistor Q5 and the gate of the N-type transistor M5 are coupled to a common contact point of the dividing resistances R1 and R2, and a gate of the N-type transistor M4 is coupled to a common contact point of the dividing resistance R2 and the N-type transistor M2. Furthermore, a gate of the P-type transistor Q3 and a gate of the N-type transistor M3 receive a bias enabling signal BE1. The bias enabling signal BE1 is used to control a conducting state of the P-type transistor Q3 and the N-type transistor M3, such that the bias signal VB1 output by the bias unit 202 is adjusted (e.g. a bias voltage CBN generated from a common contact point of the P-type transistor Q4 and the P-type transistor Q5, and a bias voltage CBP generated from a common contact point of the N-type transistor M5 and the N-type transistor M4).

Further, in clamp unit 204, the N-type transistor M6 and the P-type transistor Q6 are serially connected between the operation voltage VCC and the ground voltage. The N-type transistor M6 and the P-type transistor Q6 respectively receive the bias voltage CBN and the bias voltage CBP from the bias unit 202, and accordingly generate the clamp voltage VC on the common contact point between the N-type transistor M6 and the P-type transistor Q6.

Figure 4:
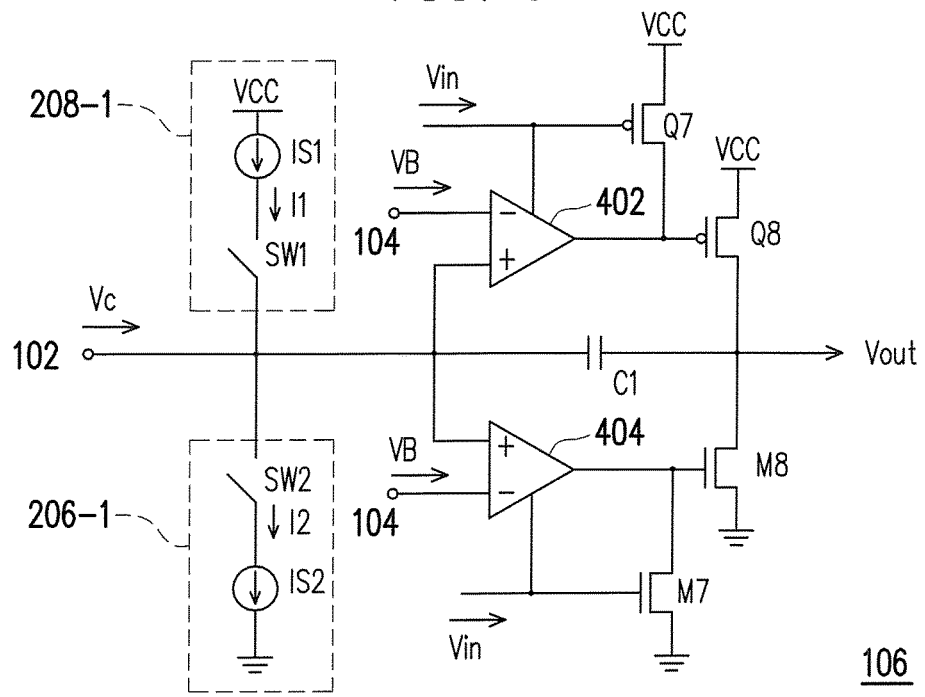
FIG. 4 is a schematic of a rate control circuit for rising/falling edge according to an embodiment of the invention.

Moreover, specifically, the rate control circuit for rising/falling edge 106 may be implemented in the manner shown in FIG. 4. In FIG. 4, an operation amplifier 402, P-type transistors Q7 and Q8, and a capacitor unit C1 are capable of forming the integrator unit 206-2, and an operation amplifier 404, N-type transistors M7 and M8, and the capacitor unit C1 are capable of forming the integrator unit 208-2. Wherein negative input ends of the operation amplifiers 402 and 404 are coupled to the bias circuit 104, and positive input ends of the operation amplifiers 402 and 404 are coupled to the clamp circuit 102, and an output of the operation amplifier 402 is coupled to a drain of the P-type transistor Q7 and a gate of the P-type transistor Q8, and a source of the P-type transistor Q7 and a source of the P-type transistor Q8 are coupled to the operation voltage VCC, and the capacitor unit C1 is coupled between a positive input end of the operation amplifier 402 and a drain of the P-type transistor Q8. Further, a gate of the P-type transistor Q7 and an enabling end of the operation amplifier 402 receive an input signal Vin. An output of the operation amplifier 404 is coupled to a drain of the N-type transistor M7 and a gate of the N-type transistor M8, and a source of the N-type transistor M7 and a source of the N-type transistor M8 are coupled to the ground voltage, and the capacitor unit C1 is coupled between a positive input end of the operation amplifier 404 and a drain of the N-type transistor M8. Further, a gate of the N-type transistor M7 and an enabling end of the operation amplifier 404 receive the input signal Vin. It is worthy to note that the input signal Vin only enables one of the operation amplifiers 402 and 404 during any period of time, i.e. if the operation amplifier 402 is enabled (i.e. the integrator unit 206-2 is enabled by the input signal Vin), the operation amplifier 404 is disabled (i.e. the integrator unit 208-2 is disabled by the input signal Vin). Conversely, if the operation amplifier 404 is enabled (i.e. the integrator unit 208-2 is enabled by the input signal Vin), the operation amplifier 402 is disabled (i.e. the integrator unit 206-2 is disabled by the input signal Vin). In other words, only one of the rising edge rate control unit 206 and the falling edge rate control unit 208 is enabled in any given period of time.

Additionally, in FIG. 4, the current source unit 206-1 includes a current source IS2 and a switch SW2. The current source unit 208-1 includes a current source IS1 and a switch SW1. The current source IS1 and the switch SW1 may be for instance implemented with P-type transistors, and the current source IS2 and the switch SW2 may be for instance implemented with type N transistors. The invention does not set a particularly limit. The current sources IS1 and IS2 are used to respectively supply current to I1 and I2, and the switches SW1 and SW2 are controlled by the input signal Vin to turn on/off. When the operation amplifier 402 is enabled by the input signal Vin, the switch SW2 is also enabled by the input signal Vin, and the switch SW1 is disabled by the input signal Vin. Conversely, when the operation amplifier 404 is enabled by the input signal Vin, the switch SW1 is also enabled by the input signal Vin, and the switch SW2 is disabled by the input signal Vin.

Figure 5:
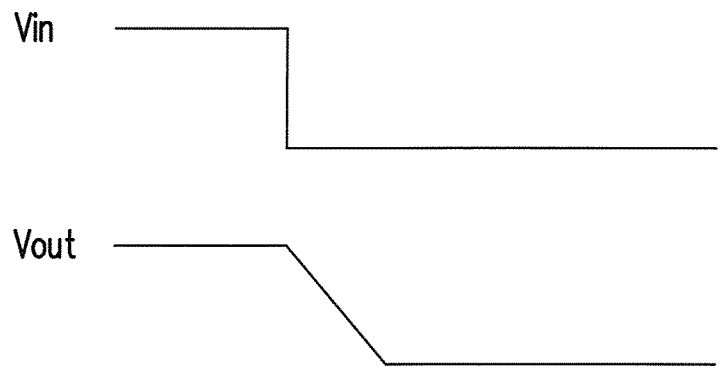
FIG. 5 is a schematic of a waveform of an input signal and a buffered signal according to another embodiment of the invention.

FIG. 5 is a schematic of a waveform of an input signal and a buffered signal according to another embodiment of the invention. Please refer to FIG. 5. Take for instance the input signal Vin switching from a high voltage level to a low voltage level, after the input signal Vin switches to the low voltage level, the falling edge rate control unit 208 will be enabled (i.e. the operation amplifier 404 is enabled). At this time the switch SW1 is also enabled by the input signal Vin, and the rising edge rate control unit 206 and the switch SW2 are disabled by the input signal Vin. As shown in FIG. 5, after the input signal Vin is switched to the low voltage level, the N-type transistor M7 is turned off and the N-type transistor M8 is turned on. At this time the current I1 provided by the current source IS1 flows to ground through the capacitor unit C1 and the N-type transistor M8; therefore causes the voltage of the buffered signal Vout to fall to the low voltage level. The falling rate of the voltage of the buffered signal Vout may be determined by the magnitude of the current I1 and the capacity of the capacitor C1. Accordingly, after the input signal Vin switches from the low voltage level to the high voltage level, the voltage of the buffered signal Vout will start to rise to the high voltage level. The operation method will not be repeated here since it is similar to that described above such that those skilled in the art can infer from FIG. 5.

Figure 6:
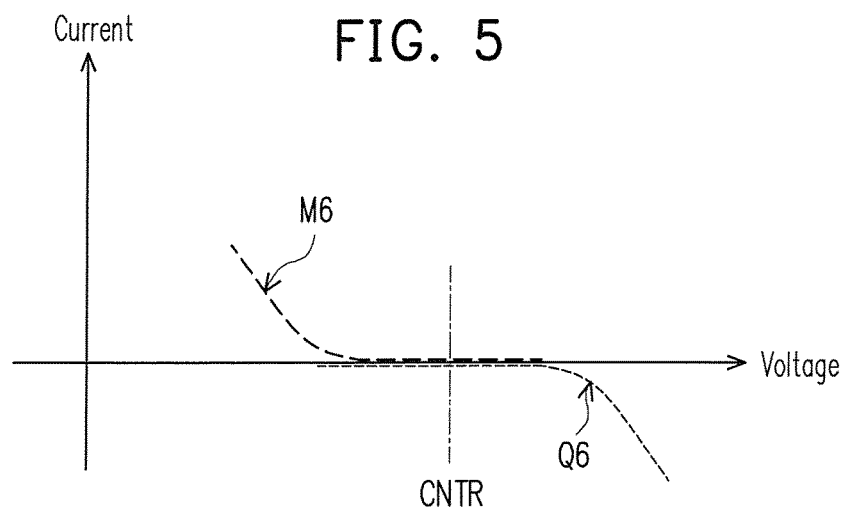
FIG. 6 is a schematic of the currents relationship between a voltage of a positive input end of an operation amplifier and an N-type transistor M6 and a P-type transistor Q6 according to an embodiment of the invention.

In some of the embodiments of the disclosure, negative inputs of the operation amplifiers 402 and 404 may be coupled to a common contact point of the dividing resistances R1 and R2, and a voltage value of a divider voltage CNTR of the common contact point of dividing resistances R1 and R2 is ½ of the voltage value of the operation voltage VCC. As the currents relationship between the positive input end of the operation amplifier and the N-type transistor M6 and the P-type transistor Q6 in FIG. 6 shows, in an ideal condition, when the N-type transistor M6 and the P-type transistor Q6 of the clamping unit 204 are both turned off, the clamping unit 102 does not draw current from the positive inputs of the operation amplifiers 402 and 404 (i.e. there is 0 current flowing through the N-type transistor M6 and the P-type transistor Q6), and the divider voltage CNTR falls on a central point position of a region where the N-type transistor M6 and the P-type transistor Q6 are both cut off, and the rising edge and the falling edge of the buffered signal Vout are capable of being matched. However, since the transistor pair TP1 of the bias unit 202 is configured to couple the P-type transistor Q2 to the operation voltage VCC and couple the N-type transistor M2 to the ground voltage, when the process variation is SF corner or FS corner, the divider voltage CNTR cannot be maintained on the central point position of the region where the N-type transistor M6 and the P-type transistor Q6 are both cut off, such that the rising edge and the falling edge of the buffered signal Vout cannot be matched. If the process variation is a SF corner, the curve of the N-type transistor M6 and the P-type transistor Q6 of FIG. 6 moves toward the left, and the divider voltage CNTR moves toward the right. If the process variation is a FS corner, the curve of the N-type transistor M6 and the P-type transistor Q6 of FIG. 6 moves toward the right, and the divider voltage CNTR moves toward the left; so causes the rising edge and the falling edge of the buffered signal Vout to not match.

Figure 7:
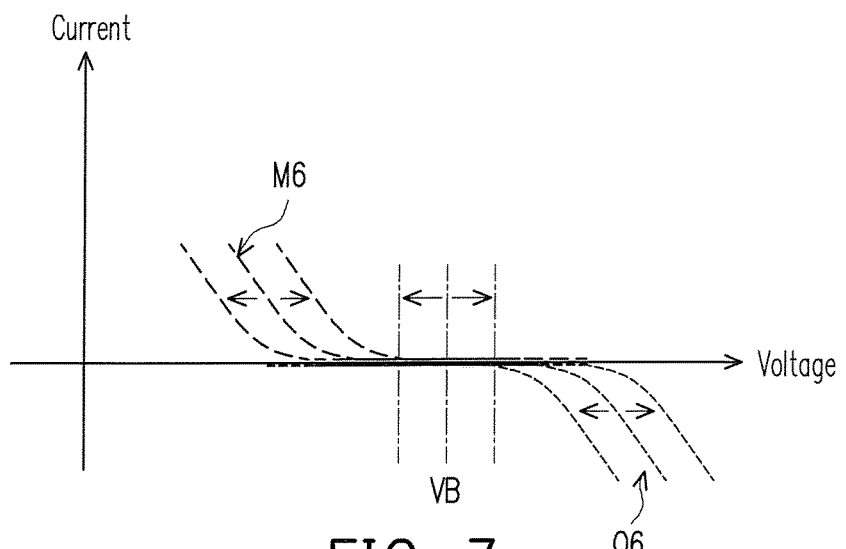
FIG. 7 is a schematic of the current flow relationship between a voltage of a positive input end of an operation amplifier and an N-type transistor M6 and a P-type transistor Q6 according to another embodiment of the invention.

In the embodiments of FIG. 2 and FIG. 4, the negative input ends of the operation amplifiers 402 and 404 are the common contact points coupled to the N-type transistor M1 and the P-type transistor Q1 of the bias circuit 104. Contrast to the configuration of the transistor pair TP1 of the bias unit 202, coupling the P-type transistor Q2 to the operation voltage VCC and coupling the N-type transistor M2 to the ground voltage, the transistor pair TP2 of the bias circuit 104 is configured to couple the N-type transistor M1 to the operation voltage VCC and couple the P-type transistor Q1 to the ground voltage. Therefore in the embodiments of FIG. 2 and FIG. 4, if the process variation is SF corner, the current flow relationship between the voltage of the positive input end of the operation amplifier and the N-type transistor M6 and the P-type transistor Q6 may be that illustrated in FIG. 7. If the process variation is SF corner, the curve of the N-type transistor M6 and the P-type transistor Q6 of FIG. 7 moves toward the left. On the other hand, in the bias circuit 104, since the N-type transistor M1 becomes slower and the P-type transistor Q1 becomes faster, the threshold voltage of the P-type transistor Q1 decreases, and the voltage difference between the gate and the source decreases; therefore the bias voltage VB also moves toward the left, such that the bias voltage VB can be maintained on the central point position of the region where both the N-type transistor M6 and the P-type transistor Q6 are cut off in FIG. 7, such that the rising edge and the falling edge of the buffered signal Vout still remain to be matching. Similarly, if the process variation is FS corner, the curve of the N-type transistor M6 and the P-type transistor Q6 of FIG. 7 moves toward the right. On the other hand, in the bias circuit 104, since the N-type transistor M1 becomes faster and the P-type transistor Q1 becomes slower, as a result the P-type transistor Q1 has a greater threshold voltage, and the voltage difference between the gate and the source is greater; therefore the bias voltage VB also moves toward the right, such that the bias voltage VB can be maintained on the central point position of the region where both the N-type transistor M6 and the P-type transistor Q6 are cut off in FIG. 7, such that the rising edge and the falling edge of the buffered signal Vout still remain to be matching.

Figure 8A:
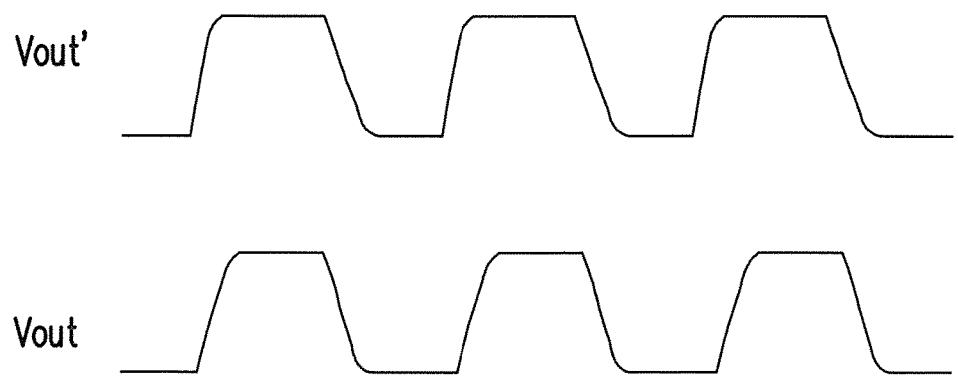
FIG. 8A is a schematic of a waveform of a buffered signal when a process variation is a SF corner according to an embodiment of the invention.
Figure 8B:
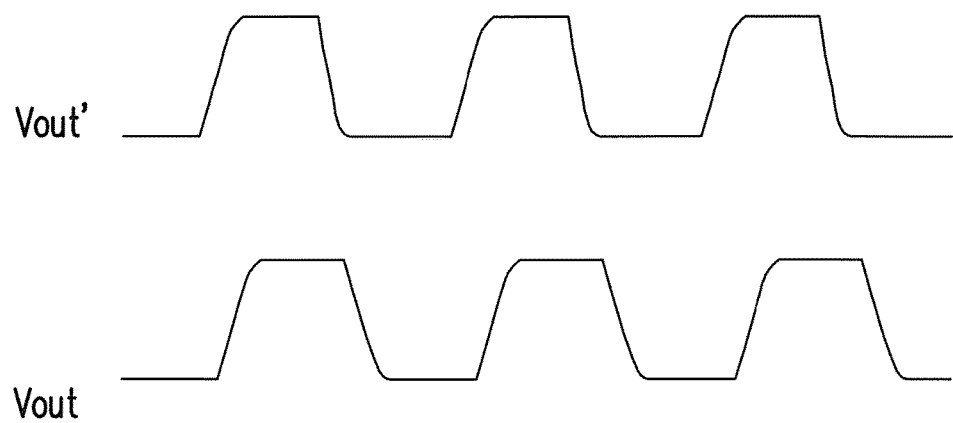
FIG. 8B is a schematic of a waveform of a buffered signal when a process variation is a FS corner according to an embodiment of the invention.

FIG. 8A and FIG. 8B are respectively waveforms of a buffered signal of the disclosure when the process variation is SF corner and when the process variation is FS corner. The Vout' of FIG. 8A and FIG. 8B are the diagrams of the waveform of the buffered signal when the negative input ends of the operation amplifier 402 and the operation amplifier 404 are coupled to the divider voltage CNTR. The Vout is the diagram of the waveform of the buffered signal when the negative inputs of the operation amplifiers 402 and 404 are coupled to the bias voltage VB. As shown in FIG. 8A and FIG. 8B, the rate control circuit for rising/falling edge 106 is capable of having rising edge and falling edge waveforms that match better according to the buffered signal Vout generated by the bias voltage VB of the bias circuit 104 (which includes the transistor pair M1 and Q1 that complement the transistor pair Q2 and M2 of the clamping circuit 102).

Based on the above, the clamp voltage is outputted via the clamp circuit and through the transistor pair having a first configuration, and outputs the bias voltage via the bias circuit and through the transistor pair having a second configuration, so as to allow the rate control circuit for rising/falling edge to buffer the input signal to generate the buffered signal according to the clamp voltage and the bias voltage. In this way the rising/falling rate of buffered signal can be effectively controlled, such that the rising and falling time of the buffered signal match.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An output buffer apparatus, comprising:
   a clamp circuit outputting a clamp voltage through a transistor pair having a first configuration;
   a bias circuit outputting a bias voltage through a transistor pair having a second configuration, wherein the bias circuit comprises:
   a first N-type transistor having a drain coupled to an operation voltage, and a gate and a source of the first N-type transistor are connected to each other; and
   a first P-type transistor, coupled between the source of the first N-type transistor and a ground voltage, and a gate and a drain of the first P-type transistor are connected to each other, and a common contact point of the first N-type transistor and the first P-type transistor is configured to output the bias voltage; and
   a rate control circuit for rising/falling edge, coupled to the clamp circuit and the bias circuit, wherein the rate control circuit for rising/falling edge buffers an input signal to generate a buffered signal and controls a rate of rising/falling edge of the buffered signal according to the clamp voltage and the bias voltage.

2. The output buffer apparatus as claimed in claim 1, wherein the clamp circuit comprises:
   a bias unit, comprising the transistor pair having the first configuration and generating a bias signal through the transistor pair having the first configuration; and
   a clamp unit, coupled to the bias unit and generating the clamping voltage according to the bias signal generated by the bias unit.

3. The output buffer apparatus as claimed in claim 2, wherein the clamp unit comprises:
   a second N-type transistor having a drain coupled to the operation voltage; and
   a second P-type transistor, coupled between a source of the second N-type transistor and the ground voltage, and a gate of the second N-type transistor and a gate of the second P-type transistor are coupled to the bias unit to receive the bias signal, and a common contact point of the second P-type transistor and the second N-type transistor is configured to output the clamp voltage.

4. The output buffer apparatus as claimed in claim 3, wherein the bias unit comprises:
   a third P-type transistor having a source coupled to the operation voltage;
   a fourth P-type transistor having a source coupled to a drain of the third P-type transistor, and a drain of the fourth P-type transistor is connected to a gate of the third P-type transistor;
   a third N-type transistor having a source coupled to the ground voltage, and a gate and a drain of the third N-type transistor are connected to each other;
   a first dividing resistance having one end coupled to the drain of the fourth P-type transistor;
   a second dividing resistance coupled between another end of the first dividing resistance and the drain of the third N-type transistor;
   a fourth N-type transistor coupled between the drain of the third N-type transistor and the ground voltage, and a gate of the fourth P-type transistor and a gate of the fourth N-type transistor are coupled to a bias enabling signal;
   a fifth P-type transistor having a source coupled to the operation voltage, and a gate of the fifth P-type transistor is coupled to the drain of the fourth P-type transistor;
   a fifth N-type transistor having a source coupled to the ground voltage, and a gate of the fifth N-type transistor is coupled to the drain of the third N-type transistor;
   a sixth P-type transistor having a source coupled to a drain of the fifth P-type transistor and the gate of the second N-type transistor, and a gate of the sixth P-type transistor and a drain of the sixth P-type transistor are coupled to a common contact point of the first dividing resistance and the second dividing resistance; and
   a sixth N-type transistor having a source coupled to a drain of the fifth N-type transistor and the gate of the second P-type transistor, and a drain of the sixth N-type transistor is coupled to a drain of the sixth P-type transistor, and a gate of the sixth N-type transistor and a drain of the sixth N-type transistor are coupled to the common contact point of the first dividing resistance and the second dividing resistance.

5. The output buffer apparatus as claimed in claim 1, wherein the rate control circuit for rising/falling edge comprises:
   a rising edge rate control unit for controlling a rising rate of a rising edge of the buffered signal, the rising edge rate control unit comprising:
   a first current source unit providing a first current; and
   a first integrator unit, coupled to the first current source unit, the clamping circuit, and the bias circuit; and
   a falling edge rate control unit for controlling a falling rate of a falling edge, the falling edge rate control unit comprising:
   a second current source unit providing a second current; and
   a second integrator unit, coupled to the second current source unit, the clamp circuit, and the bias circuit, and the first integrator unit and the second integrator unit respectively perform integration on the first current and the second current according to the clamp voltage and the bias voltage so as to generate the buffered signal, wherein when one of the first integrator unit and the second integrator unit is enabled by the input signal, the other of the first integrator unit and the second integrator unit is disabled by the input signal.

6. The output buffer apparatus as claimed in claim 5, wherein the first integrator unit comprises:
   an operation amplifier having an enabling end receiving the input signal;
   a capacitor unit having one end coupled to a positive input end of the operation amplifier;
   a first P-type transistor, coupled between an output end of the operation amplifier and an operation voltage, and a gate of the first P-type transistor receives the input signal; and
   a second P-type transistor, coupled between another end of the capacitor unit and the operation voltage, and a gate of the second P-type transistor is coupled to the output end of the operation amplifier,
   wherein a negative input end of the operation amplifier receives the bias voltage.

7. The output buffer apparatus as claimed in claim 6, wherein the first current source comprises:
- a current source providing a first current; and
- a switch, coupled to the current source and the positive input end of the operation amplifier, wherein the switch is controlled by the input signal and is capable of being turned on when the operation amplifier is enabled.

8. The output buffer apparatus as claimed in claim 5, wherein the second integrator unit comprises:
- an operation amplifier, having an enabling end receiving the input signal;
- a capacitor unit having one end coupled to a positive input end of the operation amplifier;
- a first N-type transistor, coupled between an output end of the operation amplifier and a ground voltage, and a gate of the first N-type transistor receives the input signal; and
- a second N-type transistor, coupled between another end of the capacitor unit and the ground voltage, and a gate of the second N-type transistor is coupled to the output end of the operation amplifier, wherein a negative input end of the operation amplifier receives the bias voltage.

9. The output buffer apparatus as claimed in claim 8, wherein the second current source comprises:
- a current source providing a second current; and
- a switch, coupled to the current source and the positive input end of the operation amplifier, and the switch is controlled by the input signal and is capable of being turned on when the operation amplifier is enabled.

* * * * *